United States Patent
Vermeeren et al.

(10) Patent No.: US 8,564,377 B2
(45) Date of Patent: Oct. 22, 2013

(54) MEMS OSCILLATOR

(75) Inventors: Petrus Antonius Thomas Marinus Vermeeren, Eindhoven (NL); Jozef Thomas Martinus van Beek, Rosmalen (NL)

(73) Assignee: NXP B.V., Eindhoven (NL)

( * ) Notice: Subject to any disclaimer, the term of this patent is extended or adjusted under 35 U.S.C. 154(b) by 69 days.

(21) Appl. No.: 13/271,970

(22) Filed: Oct. 12, 2011

(65) Prior Publication Data
US 2012/0086514 A1    Apr. 12, 2012

(30) Foreign Application Priority Data
Oct. 12, 2010    (EP) .................................. 10187296

(51) Int. Cl.
*H03B 5/30*    (2006.01)
(52) U.S. Cl.
USPC .......... 331/154; 331/116 M; 331/74; 331/186
(58) Field of Classification Search
CPC ............ H03B 5/30; H03B 5/32; H03B 5/323; H03B 2200/0014
USPC ..... 331/116 R, 116 FE, 116 M, 154, 74, 185, 331/186
See application file for complete search history.

(56) References Cited

U.S. PATENT DOCUMENTS

| | | | |
|---|---|---|---|
| 2007/0257740 A1* | 11/2007 | Boser et al. | 331/154 |
| 2009/0212877 A1* | 8/2009 | Ogasawara | 331/116 M |
| 2010/0219895 A1 | 9/2010 | Duraffourg et al. | |

FOREIGN PATENT DOCUMENTS

| | | |
|---|---|---|
| EP | 0 959 333 A2 | 11/1999 |
| WO | 2004/053431 A2 | 6/2004 |
| WO | 2008/149298 A1 | 12/2008 |
| WO | WO 2010073213 A2 * | 7/2010 |

OTHER PUBLICATIONS

Bontemps, J. J. M. et al. "56 MHZ Piezoresistive Micromechanical Oscillator", IEEE Solid-State Sensors, Actuators and Microsystems Conf., Transducers 2009, pp. 1433-1436 (Jun. 21, 2009).
Extended European Search Report for Patent Appln. No. 10187296.8 (Apr. 6, 2011).

* cited by examiner

*Primary Examiner* — Ryan Johnson (57) ABSTRACT

A piezoresistive MEMS oscillator uses an output circuit to control the voltage across the resonator body. This results in a DC bias of the resonator. A current path is provided between the output of the output circuit and the resonator body, such that changes in current through or voltage across the resonator body, resulting from changes in resistance of the resonator body, are coupled to the output. This arrangement uses the bias current flowing through the resonator to derive the output. In this way, the same DC current is used to provide the required DC resonator bias and to drive the output circuit to its DC operating point.

16 Claims, 10 Drawing Sheets

MEMS OSCILLATOR

This application claims the priority under 35 U.S.C. §119 of European patent application no. 10187296.8 filed on Oct. 12, 2010, the contents of which are incorporated by reference herein.

FIELD OF THE INVENTION

This invention relates to MEMS oscillators, for example for generating clock signals or reference frequency signals.

Electronic components inside flat objects, such as tags, bank cards or ID cards require a low profile of typically less than 0.5 mm. It is anticipated that flat, low-cost, and low power real time clocks (RTCs) and frequency reference oscillators (RFOs) are required residing inside these flat objects for future applications in the e-security, pharmaceutical, and food industry. An oscillator comprises a resonator and a feedback amplifier circuit, which are connected in a closed feedback loop. State-of-the-art RTCs make use of quartz crystal resonators with a height profile that typically exceeds the allowed sub-mm specification needed for their incorporation into flat products like cards, tags, and sheets of (value) paper. The main reason for this is because the packaging technology being used to encapsulate the quartz crystal does not lend itself well to miniaturization.

Furthermore, quartz resonators cannot be integrated easily on a Si chip. Therefore, the integration of a complete oscillator consisting of the crystal and amplifier cannot be realized on a single chip and further prohibits the miniaturization of RTCs and RFOs. In contrast, a MEMS resonator can be processed and packaged using surface micro-machining techniques and can be integrated with the amplifier circuit to form a very small form-factor oscillator.

Surface micro-machining is a technique whereby freestanding and moveable structures are made on top of a substrate using thin film deposition and etching techniques. In this way, both the resonator and its package can be processed on top of e.g. a Si wafer. The packaged resonator has a height of only several thin films measuring about 10 µm in total thickness. Furthermore, surface micro-machining allows for the definition of many thousands of packaged resonators onto a single wafer without making use of expensive assembly steps. The production cost associated with micro-machining decreases when the area occupied by a single device decreases. In this way, miniaturization of the resonator also has cost advantages. For quartz resonators, the production cost increases when the size of the resonator decreases as a result of the assembly-like production process that is being used.

MEMS-resonator based oscillators thus allow for low profile and low cost clocks and oscillators. However, they do not necessarily consume little power. Piezoresistive MEMS resonators require a body DC bias-current and a DC polarization voltage for their electrode. The body of a piezoresistive resonator is fed a DC-current. By applying an AC-signal to an attached but isolated electrode ('gate') the resistivity of the body is modulated, so a signal voltage develops. This takes place in a narrow frequency region for proper operation.

The various current paths can result in significant power consumption.

SUMMARY OF THE INVENTION

According to the invention, there is provided a piezoresistive MEMS oscillator comprising:
a resonator body;
at least one drive electrode located adjacent the resonator body for providing an actuation signal;
at least one bias electrode for supplying a bias current to the resonator body;
an output circuit for generating an output which is a function of changes in resistance of the resonator body,
wherein the output circuit controls the voltage across or current through the resonator body, wherein a current path is provided between the output of the amplifier circuit and the resonator body, and wherein changes in current through the resonator body or voltage across the resonator body, resulting from changes in resistance of the resonator body, result in a change in current flow or voltage at the amplifier output.

This arrangement uses the bias current flowing through the resonator to play a role in deriving the circuit output. In this way, the same current is used to provide the required DC resonator bias and to drive the output circuit at its DC operating point and generate the output. The current path between the output of the output circuit and the resonator body can include other components (such as resistors or transistors). However, there is a path between the output and the resonator so that the resonator DC bias current (or a fraction of it) can flow in operation between the output and the resonator. The actual current is not necessarily sourced from the output—it may be sourced from the voltage supply. The current path however includes one or more components of the output circuit and thereby plays a role in defining the output circuit operating point. Thus, the output stage and the resonator are not separate isolated circuit units, but they are instead interconnected by a current path which means that the DC bias which sets the DC operating point of each has a shared current component.

By using the same current for both the resonator-biasing as well as for the biasing of the output circuit (i.e. the readout interface), a MEMS-based oscillator with a lower total power consumption can be realized.

The output circuit can comprise part of an amplifier circuit, or indeed it may comprise the complete amplifier circuit (if the amplifier circuit is designed with a single stage).

Preferably, the output circuit and the resonator body are in series between power supply rails. Thus, the current flow across the output circuit is the same as the current flow through the resonator.

An active load can be used to supply current to the series connection of the output circuit and resonator. The output circuit preferably comprises a DC bias terminal for setting a DC bias of the amplifier circuit.

In one example, the output circuit comprises an amplifier circuit with a transistor (common gate or common base) in series with the resonator body, with a DC bias applied to the DC bias terminal, and the DC bias terminal comprises the gate or base. This provides a particularly simple circuit implementation with a current source (the active load) and a single transistor functioning as the amplifier circuit. The output of the amplifier circuit is then at the drain or collector of the transistor.

In another example, the output circuit comprises an amplifier circuit which comprises first and second transistors in series with the resonator body and on opposite sides of the resonator body, with a DC bias applied to two DC bias terminals which comprise the gates or bases of the first and second transistors.

This enables the resonator terminals to be virtual earth terminals, which gives reduced sensitivity to unwanted capacitances.

In one arrangement, a fixed voltage is applied to the DC bias terminal or terminals. This causes the amplifier to hold the resonator to a fixed voltage so that changes in resonator current couple to the amplifier circuit output by the current path provided.

However, in another arrangement, a variable voltage is applied to the DC bias terminal or terminals, wherein the variable voltage is selected to provide a desired power dissipation in the resonator body. In this way, the DC bias point of the amplifier circuit is used as a power control parameter.

A circuit can be provided for sensing the electrical power dissipation in the resonator body, and a circuit is then provided for comparing the sensed electrical power dissipation with a desired power dissipation and deriving from the comparison the signal for the DC bias terminal to obtain the desired electrical power dissipation. A current sensor, a voltage sensor and a multiplier can be used. The variable voltage preferably fluctuates more slowly than the output of the amplifier circuit, and thus a slow feedback control loop is implemented for power control, compared to the resonator oscillation.

The invention also provides a method of controlling a piezoresistive MEMS oscillator comprising:
   providing an actuation signal to a resonator body;
   supplying a bias current to the resonator body;
   generating an output which is a function of changes in resistance of the resonator body using an output circuit, wherein the method comprises:
   using the output circuit to control the voltage across or current through the resonator body; and
   providing a current path between the output of the output circuit and the resonator body.

In this method, changes in current through or voltage across the resonator body, resulting from changes in resistance of the resonator body, result in a change in current flow or voltage at the output.

BRIEF DESCRIPTION OF THE DRAWINGS

Examples of the invention will now be described with reference to the accompanying drawings, in which.

DETAILED DESCRIPTION OF EMBODIMENTS

The invention provides a piezoresistive MEMS oscillator in which an output circuit controls the voltage across the resonator body, and this results in a DC bias of the resonator. A current path is provided between the output of the output circuit (i.e. the output of the oscillator) and the resonator body such that changes in current through the resonator body, resulting from changes in resistance of the resonator body, are coupled to the output. This arrangement uses the bias current flowing through the resonator to derive the output. In this way, the same current is used to provide the required DC resonator bias and to control the output circuit.

The output circuit can comprise an amplifier, or it can comprise the output stage of a multiple-stage amplifier circuit. Preferably, the output circuit is a part of the oscillator circuit with a relatively large current consumption, so that power savings are obtained by reusing the bias current of the output stage to form the resonator bias current.

Figure 1:
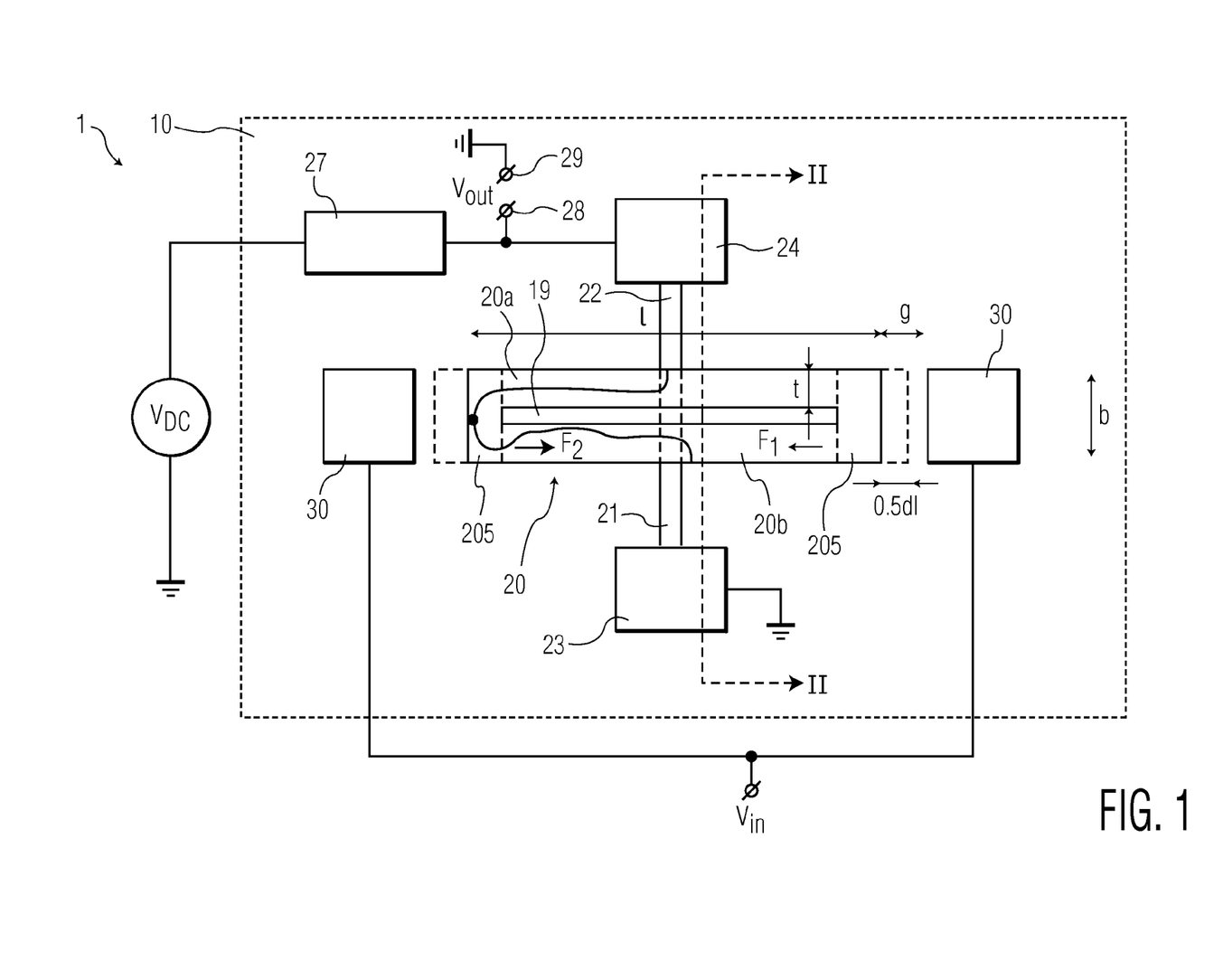
FIG. 1 shows a known piezoresistive MEMS resonator and biasing details.
Figure 2A:
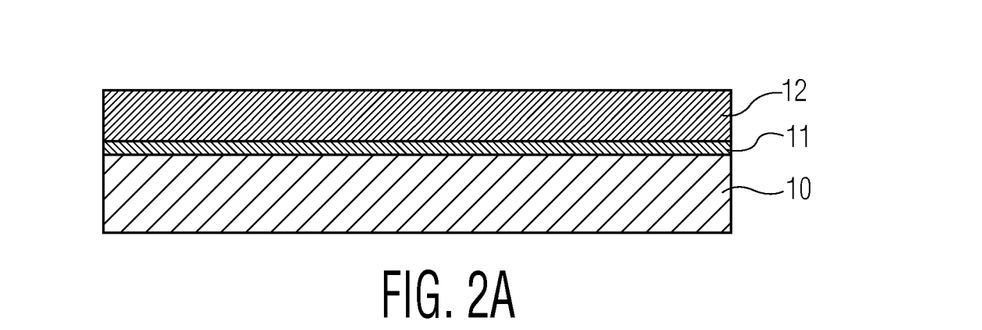
FIG. 2 shows in simplified form how the resonator of FIG. 1 is manufactured.

The invention can be applied to any known oscillator circuit using a piezoresistive resonator. To explain the drive and sensing signals needed, a single example of resonator will be described. FIG. 1 shows a known piezoresistive MEMS resonator and it associated known drive and sense circuitry, and which is described in more detail in WO 2004/053431. FIG. 2 shows the manufacturing process in simplified form.

The resonator 1 shown in FIG. 1 comprises a substrate 10 which is a silicon wafer. Alternatively, substrate 10 may be a gallium arsenide wafer or it may comprise any other semiconducting, metal or dielectric material. For resonators 1 designed for operation at frequencies above 10 MHz it is advantageous to use a substrate 10 comprising a dielectric, such as glass, because this reduces the loss of electromagnetic energy dissipated in the substrate.

Figure 2B:
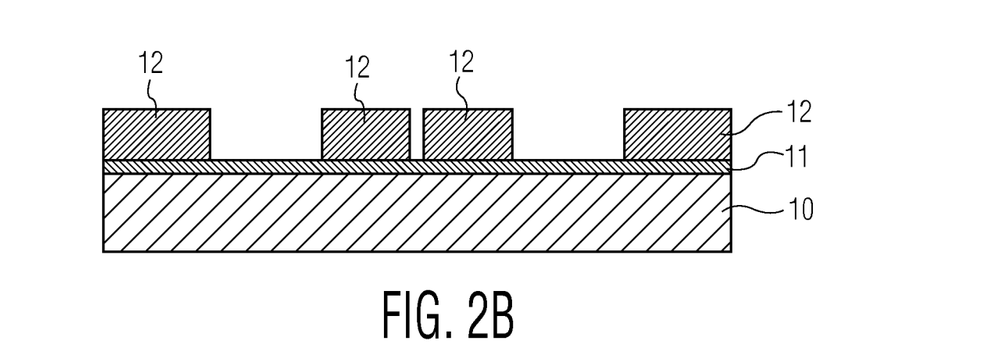
Figure 2C:
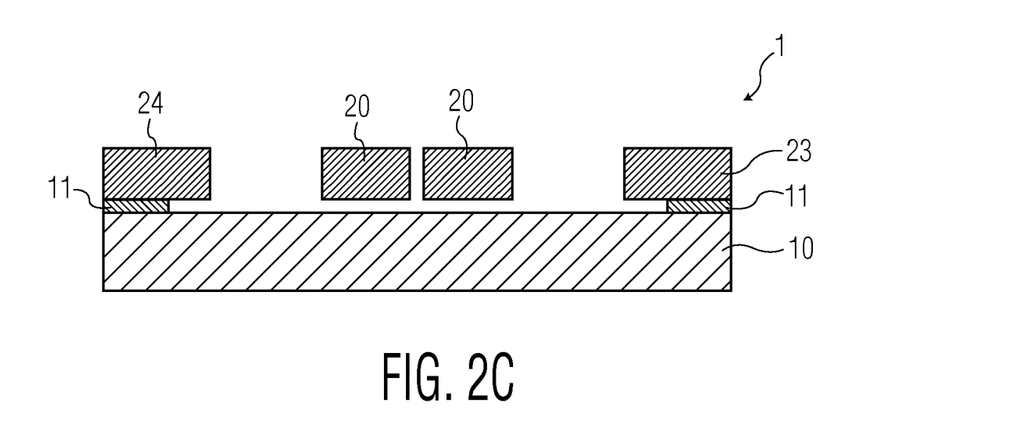

The resonator 1 further comprises an electrically conductive resonator element 20 having two parallel connecting elements 20a,20b. The resonator extends in a longitudinal direction having a length l, for operation in bulk mode. It is attached to the substrate 10 via support elements 21 and 22 which are connected to anchor elements 23 and 24, respectively. The anchor elements 23 and 24 are affixed to the substrate 10 (as is shown in FIG. 2C). The resonator element 20 and the support elements 21 and 22 are free from the substrate 10 except for the connection via the anchor elements 23 and 24.

The resonator may be manufactured using a technique well known in the field of micro electromechanical systems (MEMS). In short, the substrate 10 is first provided with an oxide layer 11 on top of which a silicon layer 12 is deposited, shown in FIG. 2A.

The silicon layer 12 is covered by a photosensitive resist, not shown, which is patterned by, e.g. lithography. The patterned resist is then developed yielding the surface areas of the resonator element 20, the support elements 21 and 22, the anchor elements 23 and 24, and the actuator terminal 30 shown in FIG. 1 covered by the resist while the remaining part of the surface is free from resist. The surface partly covered by the resist is then subjected to etching which selectively removes those parts of the silicon layer 12 that are not covered by the resist. The result of the etching is shown in FIG. 2B. Subsequently, the oxide layer 11 which is exposed due to the previous etching is etched in a second etching step. This etching step removes all exposed parts of oxide layer 11 and, moreover, some of the oxide adjacent to these parts. As a result of the second etching step, the central parts of silicon layer 12 in FIG. 2C are free from the substrate. They form the resonator element 20. At the same etching step, the oxide layer 11 under the support elements 21 and 22 is also removed such that the resonator element 20 is attached to the substrate 10 only via the anchor elements 23 and 24.

The resonator element 20 has two outer ends 205 in the longitudinal direction. These can be larger than the combined width of the connecting beams 20a,20b and spacing 19 to define wider resonator masses at the ends, and thereby define a so-called dog-bone shape.

Each of the outer ends 205 is faced by a respective electrode of the electrically conductive actuator 30, and is spaced from the electrode by an actuation gap g. The actuators can be considered to be gate terminals, in that the control input is applied to these terminals. The actuator 30 is able to receive an actuation potential difference $V_{IN}$ with respect to the resonator element 20 for elastically deforming the resonator element 20, using the electrostatic force. The actuation potential difference is a function of the input signal applied to the resonator 1. In addition to the input signal the actuation potential difference may typically further contain a DC component. The elastic deformation comprises a change of the length l by an amount dl shown in FIG. 1.

The resonator element 20 is part of an oscillator circuit which is able to conduct an electrical current through the resonator element 20.

In the known circuit configuration of FIG. 1, the resonator element 20 is electrically connected to the positive or negative pole of a DC voltage source $V_{DC}$ via an auxiliary resistor 27, the anchor element 24 and the support element 22. The anchor 24 can be considered to be a drain terminal in that the DC voltage bias is applied to this terminal to drive a bias current through the device. The resonator element 20 is further connected to ground via the support element 21 and the anchor element 23. The anchor 23 can be considered to be a source terminal in that the bias current is collected at this terminal. Therefore, the resonator element 20 is able to conduct an electrical current I. It constitutes a resistor with an ohmic resistance R which causes a voltage drop V when the resonator element 20 conducts the electrical current I.

The resonator element 20 constitutes a resistor with an ohmic resistance R which is a function of the change dl of the length l because the resonator element 20 comprises a central part 19 with open space. The resonator element 20 comprises the two mutually parallel beams 20a, 20b each of which is affixed to a respective support element 21 and 22. The two beams are connected with each other at the two outer ends by elements 205. The central part 19 has been created during the lithography step and the etching step described above. It prevents the current from flowing from the support element 22 to the support element 21 in a straight line. The current has to follow the conductive path formed by the resonator element 20. This conductive path extends in the longitudinal direction.

The circuit is able to produce an output signal which is a function of the change dl of the length l and which is a function of the resistance R. To this end the circuit comprises a measurement point 28 which is electrically connected to the circuit. It is situated between the auxiliary resistor 27 and the anchor element 24, and in operation it produces an electrical output signal which is the electrical potential difference Vout between the measurement point 28 and the reference point 29 which is connected to ground.

In this arrangement, the DC bias circuit and the output voltage measurement circuit are independent, and each consumes electrical power. More generally, separate currents required for each system block, such as the resonator-biasing circuit, amplifier circuitry of the output measurement circuitry, and also temperature control circuitry for providing temperature compensation. These currents increase the total power consumption. In addition, the resonator properties can usually not be completely optimized to fully use the available supply voltage, resulting in an additional power demand to accommodate the unused amount of headroom.

The invention provides an arrangement in which the DC bias circuit and the measurement circuit are designed as a combined circuit so as to reduce power consumption. In particular, the current flowing as a result of the DC voltage bias can be used as part of the voltage sensing function.

The circuit design is based on stacked system blocks, effectively re-using current. In a preferred implementation, a power control loop is also implemented to stabilize the resonator fluctuations, preventing frequency shifts of the oscillator frequency.

Figure 3:
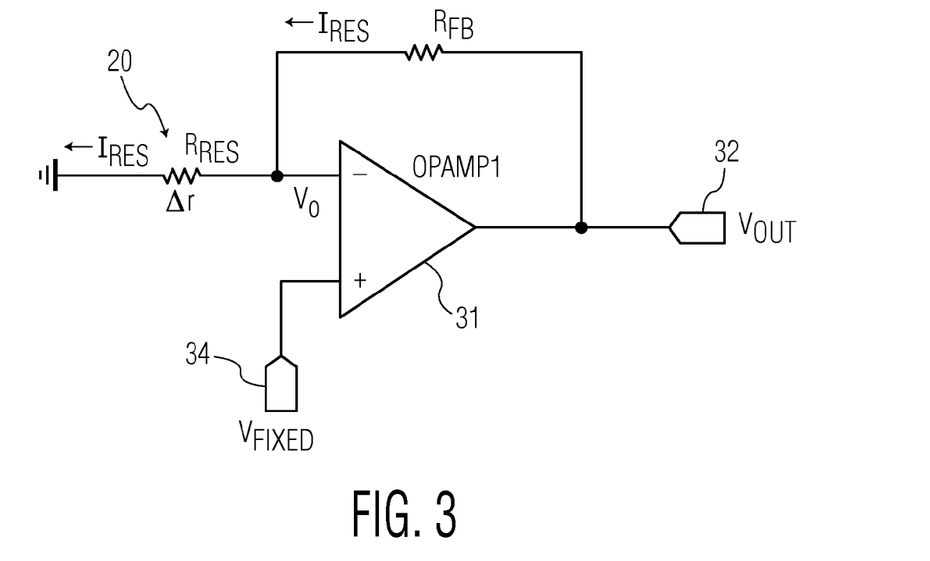
FIG. 3 shows a first example of oscillator circuit of the invention in schematic form.

FIG. 3 shows a first example of circuit of the invention in schematic form, to illustrate the signal amplification principle.

The piezoresistive resonator 20 is represented by a resistance $R_{RES}$ through which a current $I_{RES}$ flows as a result of the desired DC voltage bias. The amplifier is shown as an operational amplifier (opamp) 31 which has one input connected to a fixed DC voltage $V_{FIXED}$ at a bias terminal 34. Due to the opamp function the voltage $V_D$ on the other input terminal is constant as well.

Fluctuations at the intended oscillation frequency are represented by a change in resistance $\Delta r$ of the resonator, and lead to varying of the output voltage $V_{OUT}$ at the output 32 of the opamp 31. $V_D$ is constant, so the change in resistance $R_{RES}$ by the amount $\Delta r$ results in a change in the current flowing $I_{RES}$. This current can only flow through a negative feedback resistor $R_{FB}$ of the opamp, so the fluctuations in $R_{RES}$ result in a fluctuation of $V_{OUT}$.

Thus, the amplifier circuit controls the voltage across the resonator body by holding the resonator body to the voltage $V_D$. A current path is provided between the output of the amplifier ($V_{OUT}$) and the resonator body 20 such that changes in current through the resonator body 20, resulting from changes in resistance of the resonator body $\Delta r$, result in a change in current flow $I_{RES}$ at the amplifier output. This change in current flow is detectable, either as a current signal or a voltage level, in order to derive the oscillation signal.

It can be seen that this design reuses current flow, in that the current path between the resonator and the output (which in this schematic example is the negative feedback path) results in the same current being used for DC biasing the resonator 20 as for constructing the output signal.

In addition, as a result of the virtual-earth for the resonator to amplifier connection of the circuit of FIG. 3, a reduced sensitivity for bond pad and other stray capacitances is obtained.

FIG. 3 shows an opamp. However, the circuit of the invention can be implemented with a simpler amplifier design.

Figure 4:
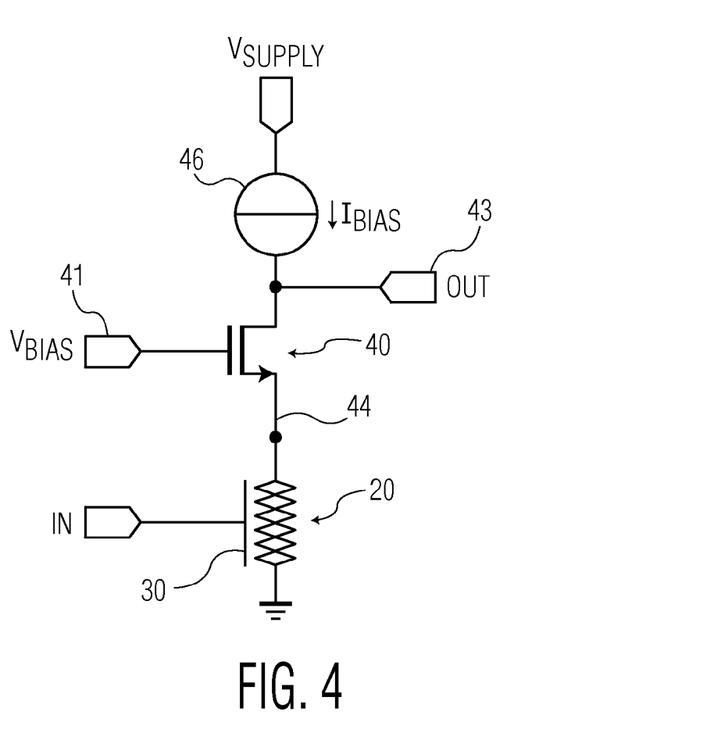
FIG. 4 shows an example of implementation of the circuit of FIG. 3.

FIG. 4 shows a configuration which uses a single MOS transistor, in common gate configuration, as the amplifier. Of course, the same function can be implemented with a common base bipolar implementation.

This transistor functions in the general manner explained with reference to FIG. 3, as outlined below.

The transistor 40 is in series between the supply voltage $V_{SUPPLY}$ and the resonator 20. The actuation electrode 30 (otherwise termed "gate electrode") of the resonator 20 has an AC input voltage IN applied in known manner.

A bias voltage $V_{BIAS}$ is applied to the gate 41 of the transistor. The DC source voltage is determined by the threshold voltage of the transistor, and the resulting voltage applied to the bias electrode 44 corresponds to the voltage $V_D$ in FIG. 3.

The current source 46 shown in FIG. 4 represents an active load of the common gate amplifier circuit. The bias current generated by the active load $I_{BIAS}$ flows through the resonator, and this therefore dictates the voltage at the bias electrode 44 which is a function of the resonator resistance.

The voltage at the transistor source is dependent on the resonator resistance, and is therefore modulated by the resonator oscillation. The common gate transistor functions as a current buffer or as a voltage amplifier for the AC signal variations, in known manner, and the output at output terminal 43 can be an output voltage or a current.

The output is essentially the transistor drain, and there is a current path from the transistor drain to the resonator, through the transistor. This current defines the DC operating point of the transistor. There is no current flow to/from the actual output (if voltage sensing is used); the current flow is sourced from the supply).

In order to prevent changes of the resonator frequency, it is known to apply a power control method. The approach of FIGS. 3 and 4 can be supplemented with a power control circuit, as shown in FIG. 5.

The amplifier circuit of FIG. 3 forces the voltage applied to the resonator $V_D$ to be fixed (equal to $V_{FIXED}$) and in FIG. 4 the voltage is not directly controlled but is the result of the currents flowing.

Figure 5:
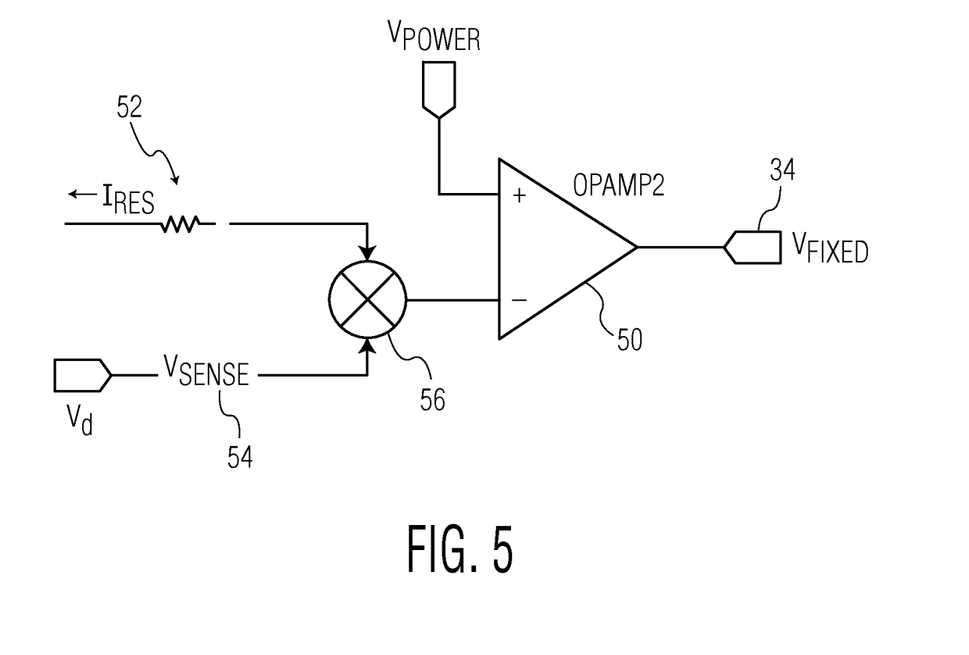
FIG. 5 shows an additional power control circuit which can be combined with the circuit of FIG. 3 or FIG. 4.

FIG. 5 shows an error amplifier 50 which is used to vary the level $V_{FIXED}$ to provide a power control function.

In particular, the value of $V_{FIXED}$ is selected to represent the desired amount of dissipated power in the resonator body, and can thus be used as a control parameter. This control loop is designed such that it can not change too fast, and in particular is at least several orders of magnitude slower than the oscillator frequency. The resonator power can then be controlled and stabilized.

From a system point of view it may be desirable that the value of $V_{FIXED}$ is not always constant but might be related to other parameters for realization of an adaptive system. A possible example can be a relation to a temperature-sensor, on-chip or otherwise, for incorporating the ambient temperature and/or dissipation into the power-level to which the resonator-power is stabilized.

The slow feedback loop consists of a sensor for determining the current through the resonator $I_{RES}$ and the voltage across the resonator $V_D$. As shown, a current sensing resistor 52 of value $R_{SENSE}$ is provided as well as a voltage sensing circuit 54.

A multiplier 56 generates the value $I_{RES}*V_D$, and the opamp 50 enforces the equality of the desired resonator power $V_{POWER}$ supplied to one terminal of the opamp 50, and the measured resonator power supplied by the multiplier 56 to the other opamp terminal. The opamp 50 generates the value $V_{FIXED}$, which is no longer totally fixed but an intermediate but slowly changing variable voltage to provide power control.

In the same way that the resonator current is used by the amplifier to generate the output signal, the power control and signal amplification share resources. Two control loops are simultaneously in operation. A fast loop implements the signal amplification and a slow loop implements the stabilisation of the resonator power. This slow loop essentially varies the DC bias of the amplifier circuit. For example, with reference to FIG. 4, the slow control loop will result in a change in the voltage $V_{BIAS}$ at the gat 41.

Only one design of resonator has been shown. However, the invention can be applied to other resonator designs. Any resonator in which the resonator oscillation results in a change in resistance which needs to be measured can be used in the oscillator circuit of the invention.

Various other designs are shown in FIGS. 6 to 11.

Figure 6:
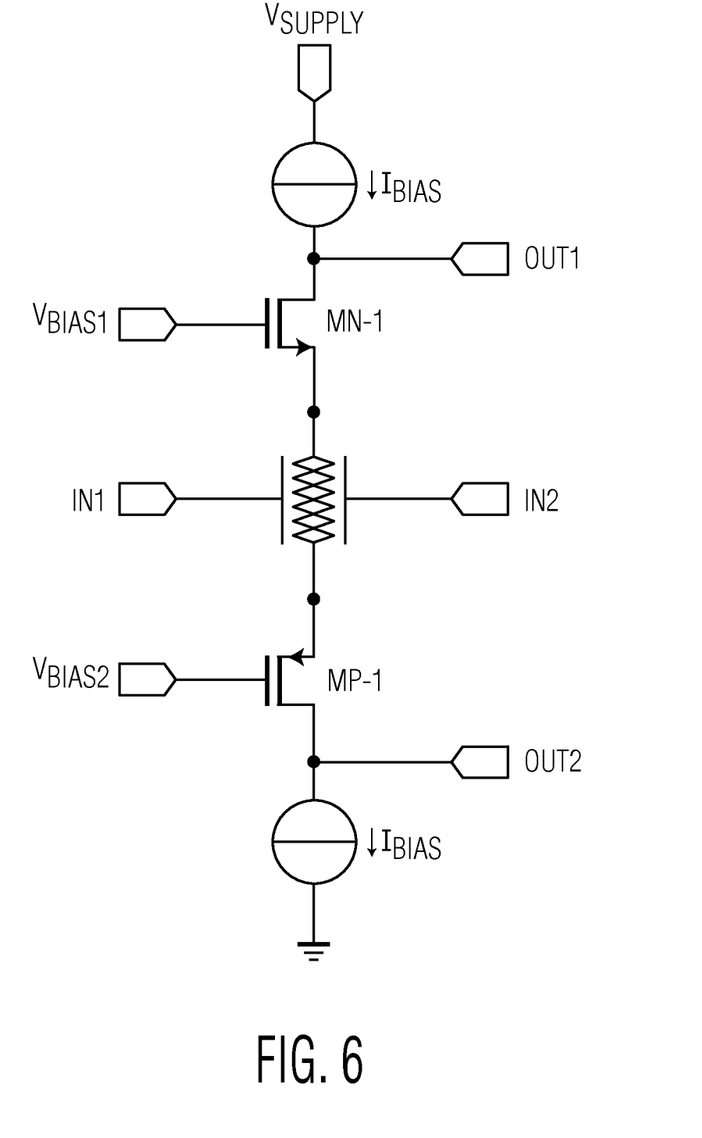
FIGS. 6 to 11 show various alternative resonator and oscillator circuit designs which operate using the same principles.

FIG. 6 shows an example of resonator with two separate gates, and which is in series between two complementary transistors MN-1 and MP-1. These together function as the amplifier, and they form a virtual earth input for the resonator, and use the same DC current. The series-connected components are biased by current sources $I_{BIAS}$.

In this way, the advantage of a virtual earth connection to the resonator, as explained with reference to the opamp implementation of FIG. 3, is obtained with a more simple circuit implementation.

Figure 7:
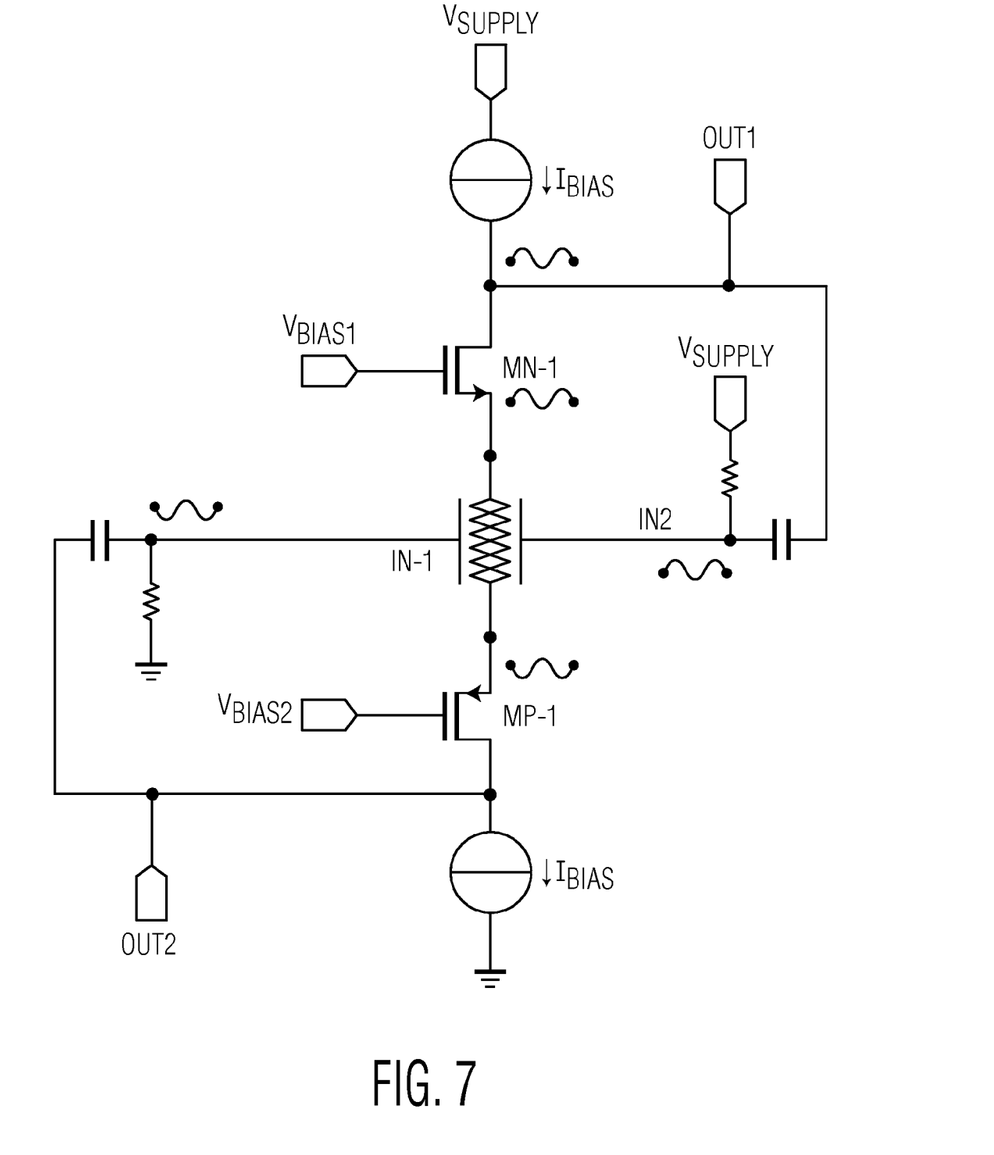

FIG. 7 shows an example of oscillator circuit based on the resonator design of FIG. 6. The oscillator circuit is implemented by closed loop connections to the resonator gates.

Figure 8:
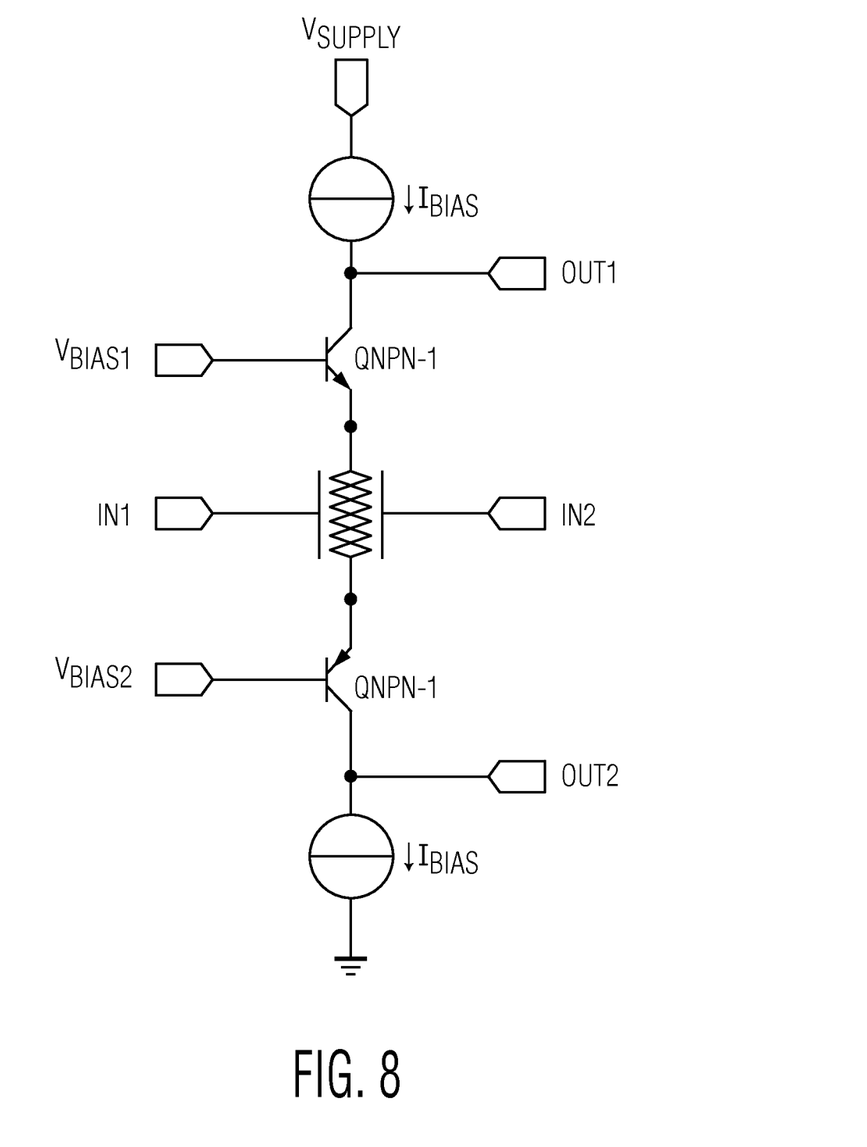

FIG. 8 shows a circuit equivalent to FIG. 6 but based on complementary bipolar transistors QNPN-1 and QPNP-1.

Figure 9:
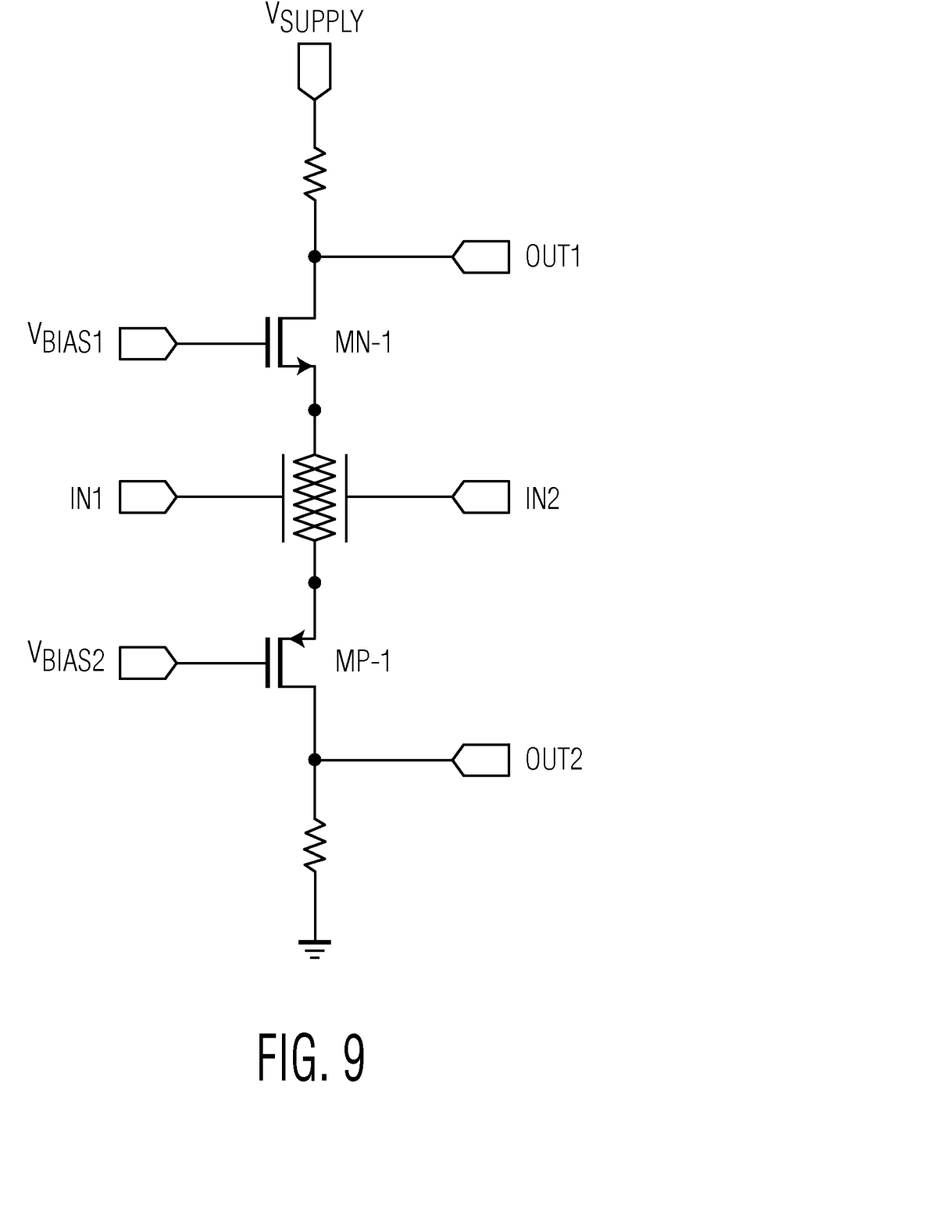

FIG. 9 shows a variation to the circuit of FIG. 6 in which resistors are used instead of current sources.

Figure 10:
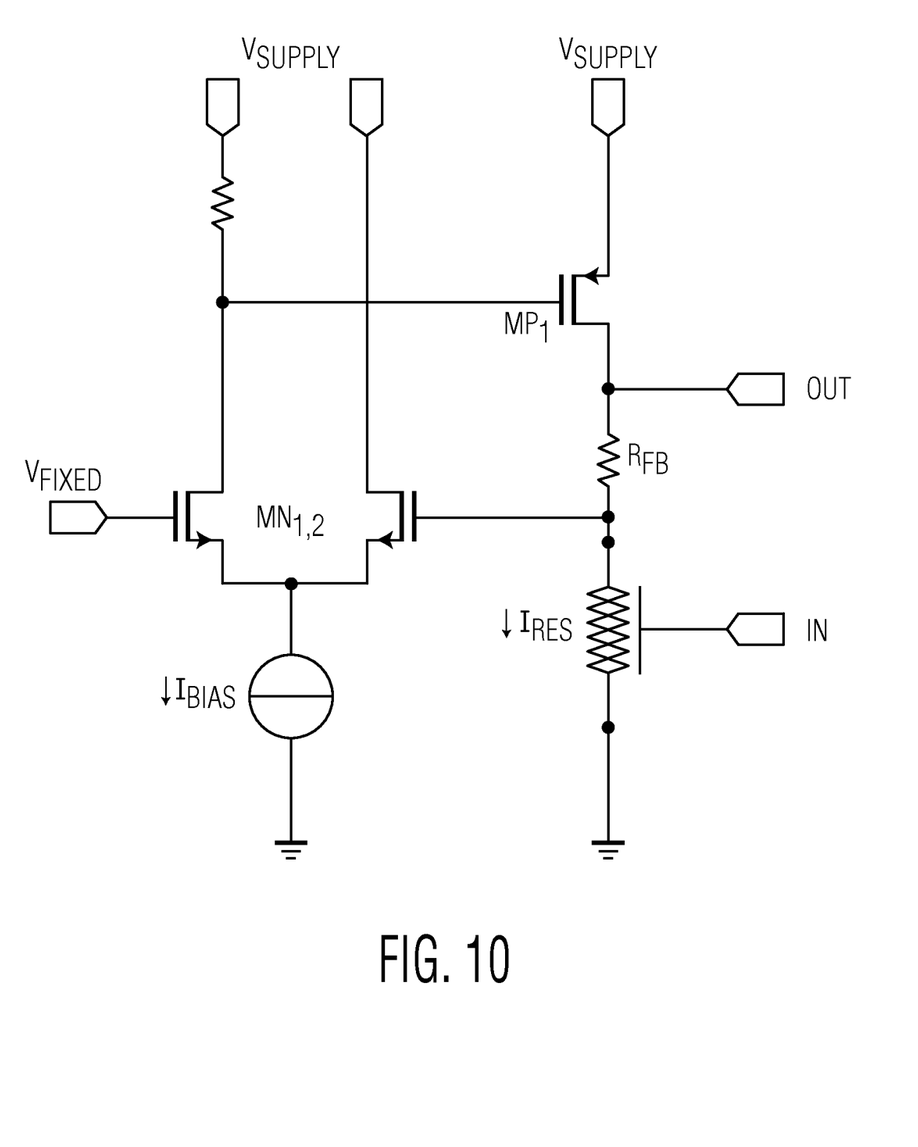

FIG. 10 shows how the schematic circuit of FIG. 3 can be implemented at transistor level.

The series connection of the output transistor MP1, the feedback resistor $R_{FB}$ and the resonator is shown. This forms an output branch. This part of the circuit carries the most current, so that the current re-use in the output branch provides significant power savings, even though the input branch is not stacked above the resonator.

Figure 11:
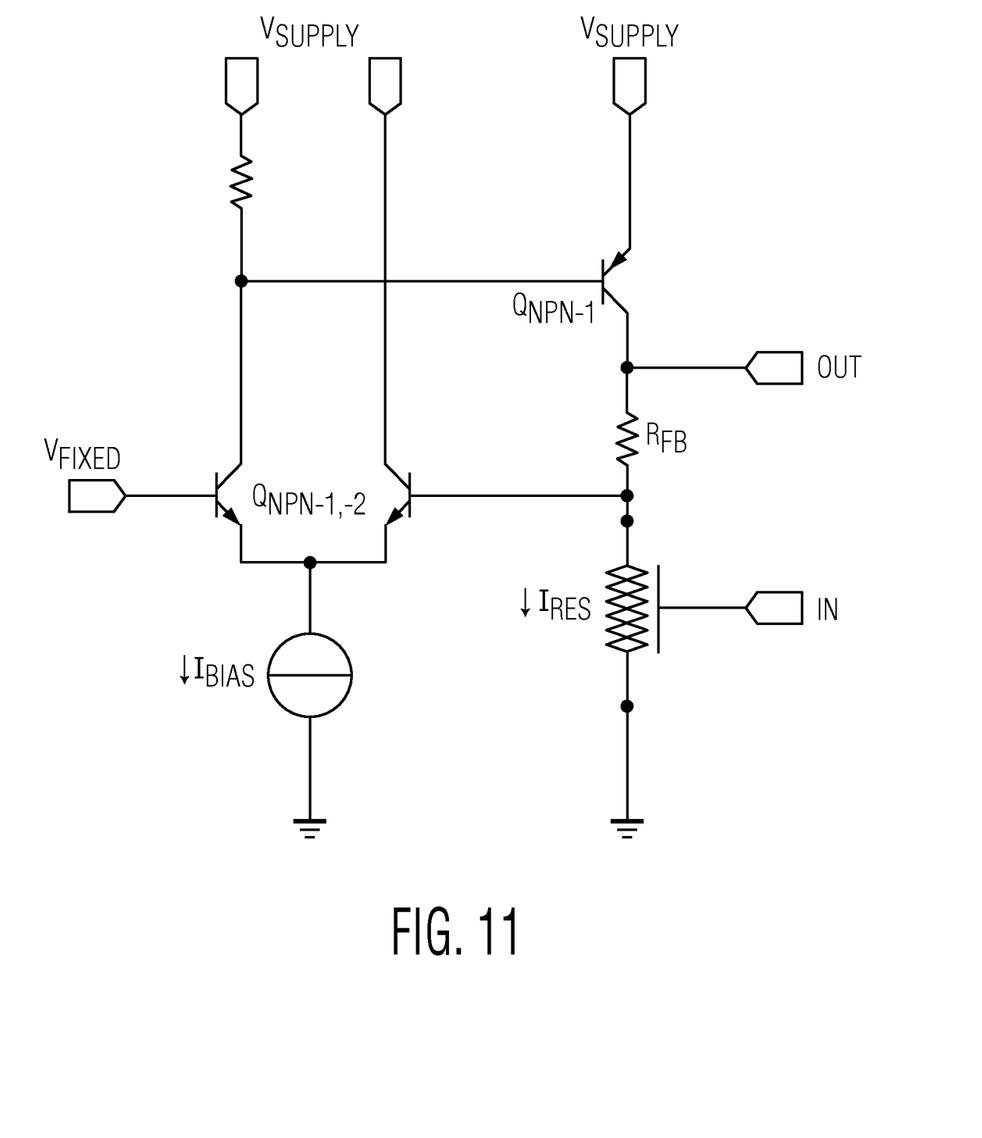

FIG. 11 shows a circuit equivalent to FIG. 10 but based on bipolar transistors.

These examples show that many different circuit implementations can benefit from the invention.

Numerous other amplifier circuits can be used. Thus, op-amps can be used, but other simpler amplifier circuits can also be used, as is clear from the examples above. By placing at least the output stage of the amplifier and resonator in series, the same current is used to bias the resonator and to provide the required current flow through the output stage of the amplifier circuit to generate the output.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A piezoresistive MEMS oscillator comprising:
a resonator body;
at least one drive electrode located adjacent the resonator body for providing an actuation signal;
at least one bias electrode for supplying a bias current to the resonator body; and
an output circuit for generating an output which is a function of changes in resistance of the resonator body,
wherein the output circuit controls a fixed voltage through the resonator body by holding the voltage across the resonator to the fixed voltage, wherein a current path is provided between the output of the output circuit and the resonator body, and wherein changes in current through the resonator body or voltage across the resonator body, resulting from changes in resistance of the resonator body, result in a change in current flow or voltage at an amplifier circuit output.

2. An oscillator as claimed in claim 1, wherein the output circuit and the resonator body are in series between power supply rails.

3. An oscillator as claimed in claim 1, further comprising an active load supplying current to a series connection of the output circuit and resonator.

4. An oscillator as claimed in claim 1, wherein the output circuit comprises a DC bias terminal for setting a DC bias of the output circuit and thereby a DC bias current in the resonator.

5. An oscillator as claimed in claim 4, wherein the output circuit comprises the amplifier circuit which comprises:
   a transistor in series with the resonator body, with the DC bias ($V_{BIAS}$) applied to the DC bias terminal, and the DC bias terminal comprises a gate or base; or
   first and second transistors in series with the resonator body and on opposite sides of the resonator body, with the DC bias ($V_{BIAS1}$, $V_{BIAS2}$) applied to two DC bias terminals which comprise the gates or bases of the first and second transistors.

6. An oscillator as claimed in claim 5, with the output or outputs of the amplifier circuit at a drain or collector of the transistor or transistors.

7. An oscillator as claimed in claim 5, wherein a fixed voltage is applied to the DC bias terminal or terminals.

8. An oscillator as claimed in claim 5, wherein a variable voltage is applied to the DC bias terminal or terminals, wherein the variable voltage is selected to provide a desired electrical power dissipation in the resonator body.

9. An oscillator as claimed in claim 8, comprising a circuit for sensing an electrical power dissipation in the resonator body, a circuit for comparing the sensed electrical power dissipation with the desired electrical power dissipation and deriving from the comparison the signal for the DC bias terminal or terminals to obtain the desired electrical power dissipation.

10. An oscillator as claimed in claim 9, wherein the circuit for sensing the electrical power dissipation comprises a current sensor and a voltage sensor and a multiplier.

11. An oscillator as claimed in claim 8, wherein the variable voltage fluctuates more slowly than the output of the amplifier circuit.

12. A method of controlling a piezoresistive MEMS oscillator comprising:
    providing an actuation signal to a resonator body;
    supplying a bias current to the resonator body;
    generating an output which is a function of changes in resistance of the resonator body using an output circuit;
    using the output circuit to control a fixed voltage through the resonator body by holding the voltage across the resonator to the fixed voltage; and
    providing a current path between the output of the output circuit and the resonator body.

13. A method as claimed in claim 12, comprising applying a voltage to a DC bias terminal of the output circuit for setting a DC bias of the output circuit.

14. A method as claimed in claim 13, wherein a variable voltage is applied to the DC bias terminal, wherein the variable voltage is selected to provide a desired power dissipation in the resonator body.

15. The method as claimed in claim 14, comprising:
    sensing electrical power dissipation in the resonator body;
    comparing the sensed electrical power dissipation with the desired electrical power dissipation and deriving from the comparison the signal for the DC bias terminal to obtain the desired electrical power dissipation.

16. A method of controlling a piezoresistive MEMS oscillator comprising:
    providing an actuation signal to a resonator body;
    supplying a bias current to the resonator body;
    generating an output which is a function of changes in resistance of the resonator body using an output circuit;
    using the output circuit to control a fixed voltage through the resonator body by holding the voltage across the resonator to the fixed voltage;
    providing a current path between the output of the output circuit and the resonator body, wherein a variable voltage is applied to the DC bias terminal, and the variable voltage is selected to provide a desired power dissipation in the resonator body,
    sensing electrical power dissipation in the resonator body; and
    comparing the sensed electrical power dissipation with the desired electrical power dissipation and deriving from the comparison the signal for the DC bias terminal to obtain the desired electrical power dissipation.

* * * * *